United States Patent
Du et al.

(10) Patent No.: US 11,661,651 B2
(45) Date of Patent: May 30, 2023

(54) METHODS AND APPARATUS FOR PASSIVATING A TARGET

(71) Applicant: APPLIED MATERIALS, INC., Santa Clara, CA (US)

(72) Inventors: Chao Du, Sunnyvale, CA (US); Xing Chen, Dublin, CA (US); Keith A. Miller, Mountain View, CA (US); Jothilingam Ramalingam, Milpitas, CA (US); Jianxin Lei, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/838,805

(22) Filed: Jun. 13, 2022

(65) Prior Publication Data

US 2022/0307126 A1    Sep. 29, 2022

Related U.S. Application Data

(62) Division of application No. 16/846,505, filed on Apr. 13, 2020, now Pat. No. 11,512,387.

(51) Int. Cl.
*H01J 37/32* (2006.01)
*C23C 14/34* (2006.01)
(Continued)

(52) U.S. Cl.
CPC ........ *C23C 14/3414* (2013.01); *C23C 14/022* (2013.01); *C23C 14/5846* (2013.01);
(Continued)

(58) Field of Classification Search
None
See application file for complete search history.

(56) References Cited

U.S. PATENT DOCUMENTS

| 5,759,287 A | 6/1998 | Chapman et al. |
| 6,183,564 B1 | 2/2001 | Reynolds et al. |
| (Continued) | | |

FOREIGN PATENT DOCUMENTS

| EP | 1071834 B1 | 10/2002 |
| JP | S63290269 A | 11/1988 |

OTHER PUBLICATIONS

International Search Report and Written Opinion dated Jul. 22, 2021 for PCT Application No. PCT/2021/026318.

*Primary Examiner* — Jason Berman
(74) *Attorney, Agent, or Firm* — Moser Taboada

(57) ABSTRACT

Methods and apparatus for passivating a target are provided herein. For example, a method includes a) supplying an oxidizing gas into an inner volume of the process chamber; b) igniting the oxidizing gas to form a plasma and oxidize at least one of a target or target material deposited on a process kit disposed in the inner volume of the process chamber; and c) performing a cycle purge comprising: c1) providing air into the process chamber to react with the at least one of the target or target material deposited on the process kit; c2) maintaining a predetermined pressure for a predetermined time within the process chamber to generate a toxic by-product caused by the air reacting with the at least one of the target or target material deposited on the process kit; and c3) exhausting the process chamber to remove the toxic by-product.

10 Claims, 2 Drawing Sheets

(51) Int. Cl.
    *C23C 14/58* (2006.01)
    *C23C 14/02* (2006.01)
(52) U.S. Cl.
    CPC .... *C23C 14/5873* (2013.01); *H01J 37/32449* (2013.01); *H01J 37/32844* (2013.01); *H01J 37/32981* (2013.01)

(56) References Cited

U.S. PATENT DOCUMENTS

| | | |
|---|---|---|
| 8,213,007 B2 | 7/2012 | Wang et al. |
| 9,274,105 B2 | 3/2016 | Guo et al. |
| 2006/0062708 A1* | 3/2006 | Pettibone ............... B01D 53/46 423/210 |
| 2013/0012033 A1* | 1/2013 | Kabe ................. H01L 21/02164 118/723 AN |
| 2018/0323046 A1 | 11/2018 | Matsuo et al. |
| 2021/0032742 A1 | 2/2021 | Jindal et al. |

\* cited by examiner

METHODS AND APPARATUS FOR PASSIVATING A TARGET

CROSS-REFERENCE TO RELATED APPLICATIONS

The present application is a divisional application of U.S. patent application Ser. No. 16/846,505, filed Apr. 13, 2020, the entire contents of which is incorporated herein by reference.

FIELD

Embodiments of the present disclosure generally relate to a methods and apparatus for passivating a target.

BACKGROUND

Process chambers, e.g., physical vapor deposition (PVD) chambers, are often used for ovonic threshold switch (OTS) fabrication. The OTS includes various types of compounds exhibiting certain electrical behavior, thus making the OTS suitable for, but not limited to, forming critical layers (e.g., selector) in memory products (e.g., PCRAM, ReRAM, etc.). The compounds (e.g., that make up the target material) can have different elements with different atomic weight percentages, but almost always have arsenic (As), thus making the compounds highly toxic and active. For example, target material that includes As can be highly reactive and can react with, for example, room air and can generate toxic by-products, such as hydride and arsine, if the target material is not fully passivated. In view thereof, care needs to be taken when performing preventive maintenance (PM) for a process chamber that was previously used for OTS fabrication (e.g., containing an OTS target). For example, PM, typically, requires passivating the OTS target and/or hydride monitoring, to ensure that the PM can be carried out in a safe manner.

Current state-of-the-art passivation techniques, typically, have very low efficiency and can last more than five days. Moreover, such passivation techniques can expose a process chamber cavity (e.g., in which the OTS target is disposed) to the environment, which, in turn, can be deleterious to an individual(s).

Accordingly, the inventors have provided improved methods and apparatus for passivating an OTS target.

SUMMARY

Methods and apparatus for passivating a target are provided herein. In some embodiments, a method includes a) supplying an oxidizing gas into an inner volume of the process chamber; b) igniting the oxidizing gas to form a plasma and oxidize at least one of a target or target material deposited on a process kit disposed in the inner volume of the process chamber; and c) performing a cycle purge comprising: c1) providing air into the process chamber to react with the at least one of the target or target material deposited on the process kit; c2) maintaining a predetermined pressure for a predetermined time within the process chamber to generate a toxic by-product caused by the air reacting with the at least one of the target or target material deposited on the process kit; and c3) exhausting the process chamber to remove the toxic by-product.

In accordance with at least some embodiments, a non-transitory computer readable storage medium having stored thereon instructions that when executed by a processor perform a method of passivating surfaces in a process chamber that includes a) supplying an oxidizing gas into an inner volume of the process chamber; b) igniting the oxidizing gas to form a plasma and oxidize at least one of a target or target material deposited on a process kit disposed in the inner volume of the process chamber; and c) performing a cycle purge comprising: c1) providing air into the process chamber to react with the at least one of the target or target material deposited on the process kit; c2) maintaining a predetermined pressure for a predetermined time within the process chamber to generate a toxic by-product caused by the air reacting with the at least one of the target or target material deposited on the process kit; and c3) exhausting the process chamber to remove the toxic by-product.

In accordance with at least some embodiments, a process chamber for passivating surfaces of the process chamber includes a target disposed in the process chamber for sputtering a target material onto a substrate disposed in the process chamber during processing; a gas source connected to the process chamber and configured to supply an oxidizing gas into an inner volume of the process chamber and configured to supply air into the inner volume of the process chamber without opening the process chamber; at least one of an RF power source or a DC power source configured to ignite the oxidizing gas to form a plasma within the process chamber; a pump configured to maintain a predetermined pressure and to exhaust the process chamber; a gas detection system configured to measure an amount of a toxic by-product in the inner volume of the process chamber; and a controller configured to control the process chamber to: a) supply an oxidizing gas into an inner volume of the process chamber from the gas source; b) ignite the oxidizing gas to form a plasma and oxidize at least one of a target or target material deposited on a process kit disposed in the inner volume of the process chamber; and c) perform a cycle purge comprising: c1) providing air into the process chamber to react with the at least one of the target or target material deposited on the process kit; c2) maintaining a predetermined pressure for a predetermined time within the process chamber to generate a toxic by-product caused by the air reacting with the at least one of the target or target material deposited on the process kit; and c3) exhausting the process chamber to remove the toxic by-product.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
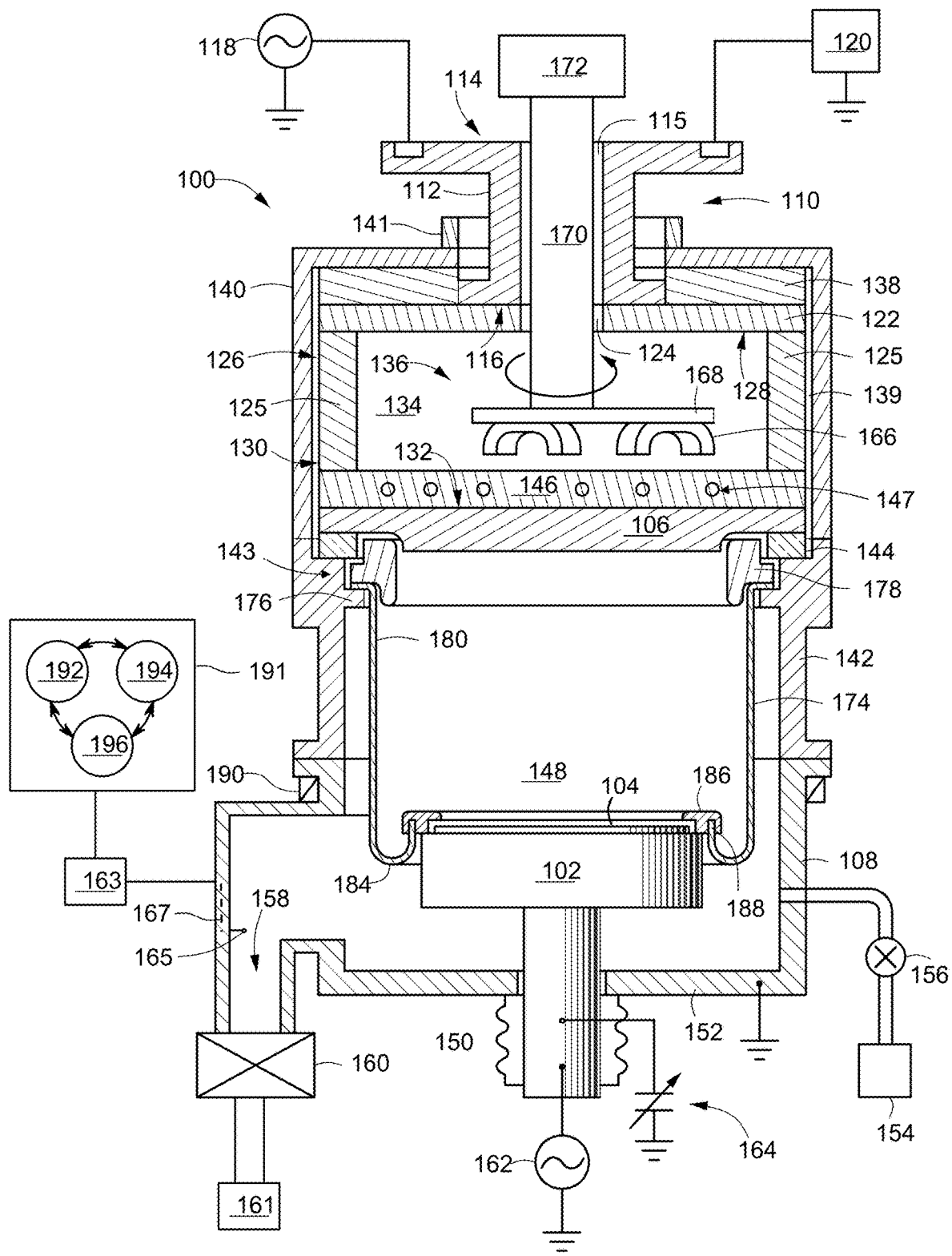
FIG. 1 depicts a schematic, cross-sectional view of a physical vapor deposition chamber (PVD) in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus for passivating a target are provided herein. For example, in at least some embodiments, the methods and apparatus described herein can be used for passivating a target (e.g., during PM), such as ovonic threshold switch (OTS) target material. More particularly, the methods and apparatus described herein can be used to passivate and stabilize a surface of the target to prevent the target from further reacting with one or more gases (e.g., air), which are sometimes used during a passivation process. Unlike the conventional methods and apparatus that can be used for passivating a target, the methods and apparatus described herein use an oxygen plasma treatment for passivating an OTS target, which results in better passivated/oxidized surface of the OTS target, in conjunction with a cycle purge that does not require exposing an inner volume of a process chamber to a surrounding environment. Accordingly, the methods and apparatus described herein provide a more efficient process for passivating a target, thus significantly reducing total passivation time, e.g., total passivation time can be reduced from more than 5 days to less than 30 hours.

FIG. 1 depicts a schematic, cross-sectional view of a PVD chamber (process chamber 100) in accordance with some embodiments of the present disclosure. Examples of suitable PVD chambers include the ALPS® Plus and SIP ENCORE® PVD processing chambers, both commercially available from Applied Materials, Inc., of Santa Clara, Calif. Other processing chambers from Applied Materials, Inc. or other manufactures may also benefit from the inventive apparatus disclosed herein.

The process chamber 100 contains a substrate support pedestal 102 for receiving a substrate 104 thereon, and a sputtering source, such as a target 106. The substrate support pedestal 102 may be located within a grounded chamber wall 108, which may be a chamber wall (as shown) or a grounded shield. A ground shield 140 is shown covering at least some portions of the process chamber 100 above the target 106 in FIG. 1. In some embodiments, the ground shield 140 could be extended below the target to enclose the pedestal 102 as well.

The process chamber 100 includes a feed structure 110 for coupling RF and DC energy to the target 106. The feed structure is an apparatus for coupling RF energy, and optionally DC energy, to the target 106, or to an assembly containing the target, for example, as described herein. The feed structure 110 includes a body 112 having a first end 114 and a second end 116 opposite the first end 114. In some embodiments, the body 112 further includes a central opening 115 disposed through the body 112 from the first end 114 to the second end 116.

The first end 114 of the feed structure 110 can be coupled to an RF power source 118 and, optionally, a DC power source 120, which can be respectively utilized to provide RF and DC energy to the target 106. For example, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. In at least some embodiments, one or both of the RF power source 118 or the DC power source 120 can be used to ignite one or more process gases during PVD and/or passivation of the target 106. The feed structure 110 may be fabricated from suitable conductive materials to conduct the RF and DC energy from the RF power source 118 and the DC power source 120. The feed structure 110 may have a suitable length that facilitates substantially uniform distribution of the respective RF and DC energy about the perimeter of the feed structure 110.

The second end 116 of the body 112 is coupled to a source distribution plate 122. The source distribution plate includes a hole 124 disposed through the source distribution plate 122 and aligned with the central opening 115 of the body 112. The source distribution plate 122 may be fabricated from suitable conductive materials to conduct the RF and DC energy from the feed structure 110.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is fluidly coupled to the central opening 115 of the body 112 via the hole 124 of the source distribution plate 122. The cavity 134 and the central opening 115 of the body 112 may be utilized to at least partially house one or more portions of a rotatable magnetron assembly 136 as illustrated in FIG. 1 and described further below. In some embodiments, the cavity may be at least partially filled with a cooling fluid, such as water (H2O) or the like.

A ground shield 140 may be provided to cover the outside surfaces of the lid of the process chamber 100. The ground shield 140 may be coupled to ground, for example, via the ground connection of the chamber body. The ground shield 140 has a central opening to allow the feed structure 110 to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the source distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

In some embodiments, a ground collar 141 may be disposed about body 112 and lower portion of the feed structure 110. The ground collar 141 is coupled to the ground shield 140 and may be an integral part of the ground shield 140 or a separate part coupled to the ground shield to provide grounding of the feed structure 110. The ground collar 141 may be made from a suitable conductive material, such as aluminum or copper, and the gap can be filled with isolating material like plastic or ceramic or can be an air gap. The ground collar 141 prevents cross-talk between the RF feed and the body 112, thereby improving plasma, and processing, uniformity.

An isolator plate 138 may be disposed between the source distribution plate 122 and the ground shield 140 to prevent the RF and DC energy from being routed directly to ground. The isolator plate 138 has a central opening to allow the feed structure 110 to pass through the isolator plate 138 and be coupled to the source distribution plate 122. The isolator plate 138 may comprise a suitable dielectric material, such as a ceramic, a plastic, or the like.

The target 106 may be supported on an adapter 142, which can be a grounded conductive aluminum adapter, through a dielectric isolator 144. The target 106 comprises a material to be deposited on the substrate 104 during sputtering, such a metal or metal oxide. For example, in some embodiments the target 106 can be made from at least one of arsenic, boron, carbon, gallium, germanium, selenium, silicon, tellurium, titanium or tungsten, such as when the target 106 is used for OTS fabrication. In some embodiments, the backing plate 146 may be coupled to the source distribution plate-facing surface 132 of the target 106. The backing plate 146 may comprise a conductive material, such as copper-zinc, copper-chrome, or the same material as the target, such that RF and DC power can be coupled to the target 106 via the backing plate 146. Alternatively, the backing plate 146 may be non-conductive and may include conductive elements (not shown) such as electrical feedthroughs or the like for coupling the source distribution plate-facing surface 132 of the target 106 to the second end 130 of the conductive member 125. The backing plate 146 may be included for example, to improve structural stability of the target 106. In at least some embodiments, one or more cooling channels/guides 147 can be provided in the backing plate 146, e.g., to facilitate cooling the target 106, such as when a passivation procedure is being performed.

The substrate support pedestal 102 has a material-receiving surface facing the principal surface of the target 106 and supports the substrate 104 to be sputter coated in planar position opposite to the principal surface of the target 106. The substrate support pedestal 102 may support the substrate 104 in an inner volume 148 of the process chamber 100. The inner volume 148 defined as the region above the substrate support pedestal 102 during processing (for example, between the target 106 and the substrate support pedestal 102 when in a processing position).

In some embodiments, the substrate support pedestal 102 may be vertically movable through a bellows 150 connected to a bottom chamber wall 152 to allow the substrate 104 to be transferred onto the substrate support pedestal 102 through a load lock valve (not shown) in the lower portion of the process chamber 100 and thereafter raised to a deposition, or processing position.

One or more processing gases (e.g., room air, oxygen, non-reactive gases including argon, helium, krypton, neon, radon, xenon, or other gas suitable for processing the substrate 104 and/or for performing a passivation process on the target 106) may be supplied from a gas source 154 through a mass flow controller 156 into the lower part of the process chamber 100. The gas source 154 can also serve for venting fresh (room) air into the inner volume 148 of the process chamber 100, such as when performing passivation of the target 106, as will be described in greater detail below. The mass flow controller 156 controls a flow of gas from the gas source 154 using, for example, a control feedback loop, as will also be described in greater detail below.

An exhaust port 158 may be provided and coupled to a pump 161 via a valve 160 for exhausting (e.g., pumping down) the inner volume 148 of the process chamber 100 and facilitating maintaining a desired pressure inside the process chamber 100. For example, the valve 160 can be configured to provide a relatively high pressure during passivation and a relatively low pressure during PVD.

A gas detection system 163 can be connected to the process chamber 100 and can be configured to detect gases being exhausting from the inner volume 148. For example, in at least some embodiments, the gas detection system 163 can be configured for gas detection, and when the process chamber 100 is being used for passivating the target 106 (e.g., during PM), the gas detection system 163 can be configured to detect toxic by-product being exhausted from the inner volume 148. An example of a gas detection system suitable for use with the methods and apparatus described herein is the SPM Flex®, available from Honeywell Analytics of Lincolnshire, Ill. The toxic by-product can include, but is not limited to, hydride, arsine, mineral acids, amines, and/or other toxic by-products. The gas detection system 163 measures an amount of the toxic by-product being exhausted from the inner volume 148 of the process chamber 100 and communicates the measured amount to a controller 191 of the process chamber 100, which, in turn, compares the measured amount with a predetermined threshold. The predetermined threshold can be determined based on the type of toxic by-product that is being detected/measured. For example, when the toxic by-product is hydride and/or arsine, the predetermined threshold can be about 0 ppb to about 100 ppb, and in some embodiments can be about 5 ppm.

Additionally, one or more sensors 165 can be connected (see phantom lines 167) to the gas detection system 163 and disposed, for example, near valve 160 to obtain data that can be used for controlling the mass flow controller 156, as described in greater detail below.

An RF bias power source 162 may be coupled to the substrate support pedestal 102 to induce a negative DC bias on the substrate 104. In addition, in some embodiments, a negative DC self-bias may form on the substrate 104 during processing. For example, RF power supplied by the RF bias power source 162 may range in frequency from about 2 MHz to about 60 MHz, for example, non-limiting frequencies such as 2 MHz, 13.56 MHz, or 60 MHz can be used. In other applications, the substrate support pedestal 102 may be grounded or left electrically floating. For example, a capacitance tuner 164 may be coupled to the substrate support pedestal for adjusting voltage on the substrate 104 for applications where RF bias power may not be desired.

A rotatable magnetron assembly 136 may be positioned proximate a back surface (e.g., source distribution plate-facing surface 132) of the target 106. The rotatable magnetron assembly 136 includes a plurality of magnets 166 supported by a base plate 168. The base plate 168 connects to a rotation shaft 170 coincident with the central axis of the process chamber 100 and the substrate 104. A motor 172 can be coupled to the upper end of the rotation shaft 170 to drive rotation of the rotatable magnetron assembly 136. The magnets 166 produce a magnetic field within the process chamber 100, generally parallel and close to the surface of the target 106 to trap electrons and increase the local plasma density, which in turn increases the sputtering rate. The magnets 166 produce an electromagnetic field around the top of the process chamber 100, and magnets 166 are rotated to rotate the electromagnetic field which influences the plasma density of the process to more uniformly sputter the target 106.

In some embodiments, a magnet 190 may be disposed about the processing chamber 100 for selectively providing a magnetic field between the substrate support pedestal 102 and the target 106. For example, as shown in FIG. 1, the magnet 190 may be disposed about the outside of the chamber wall 108 in a region just above the substrate support pedestal 102 when in processing position. In some embodiments, the magnet 190 may be disposed additionally or alternatively in other locations, such as adjacent the adapter 142. The magnet 190 may be an electromagnet and may be coupled to a power source (not shown) for controlling the magnitude of the magnetic field generated by the electromagnet.

In some embodiments, the process chamber 100 may further include a process kit 143 includes a grounded bottom shield 174 connected to a ledge 176 of the adapter 142. The process kit 143 also includes a dark space shield 178 that may be supported on the bottom shield 174 and may be fastened to the bottom shield 174 by screws or other suitable manner. The metallic threaded connection between the bottom shield 174 and the dark space shield 178 allows the bottom shield 174 and dark space shield 178 to be grounded to the adapter 142. The adapter 142 in turn is sealed and grounded to the chamber wall 108. Both the bottom shield 174 and dark space shield 178 are typically formed from hard, non-magnetic stainless steel. In at least some embodiments, the dark space shield 178 and the bottom shield 174 can be monolithically formed and provided as unitary body.

The bottom shield 174 extends downwardly and may include a generally tubular portion 180 having a generally constant or varying diameter. The bottom shield 174 extends along the walls of the adapter 142 and the chamber wall 108 downwardly to below a top surface of the substrate support pedestal 102 and returns upwardly until reaching a top surface of the substrate support pedestal 102 (e.g., forming a u-shaped portion 184 at the bottom). A cover ring 186 rests on the top of the upwardly extending inner portion 188 of the bottom shield 174 when the substrate support pedestal 102 is in a lower, loading position, but rests on the outer periphery of the substrate support pedestal 102 when the substrate support pedestal 102 is in an upper, deposition position to protect the substrate support pedestal 102 from sputter deposition.

The controller 191 includes programmable central processing unit (CPU) 192 (processor) that is operable with a memory 194 and a mass storage device, an input control unit, and a display unit (not shown), such as power supplies, clocks, cache, input/output (I/O) circuits, and the liner, coupled to the various components of the processing system to facilitate control of the substrate processing.

To facilitate control of the process chamber 100 described above, the CPU 192 may be one of any form of general-purpose computer processor that can be used in an industrial setting, such as a programmable logic controller (PLC), for controlling various chambers and sub-processors. The memory 194 is coupled to the CPU 192 and the memory 194 is a non-transitory computer readable storage medium and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Charged species generation, heating, and other processes are generally stored in the memory 194, typically as software routine. The software routine may also be stored and/or executed by a second CPU (not shown) that is remotely located from the process chamber 100 being controlled by the CPU 192.

The memory 194 is in the form of computer-readable storage media that contains instructions, that when executed by the CPU 192, facilitates the operation of the process chamber 100. The instructions in the memory 194 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such non-transitory computer-readable storage media, when carrying computer-readable instructions that direct the functions of the methods described herein, are embodiments of the present disclosure.

Figure 2:
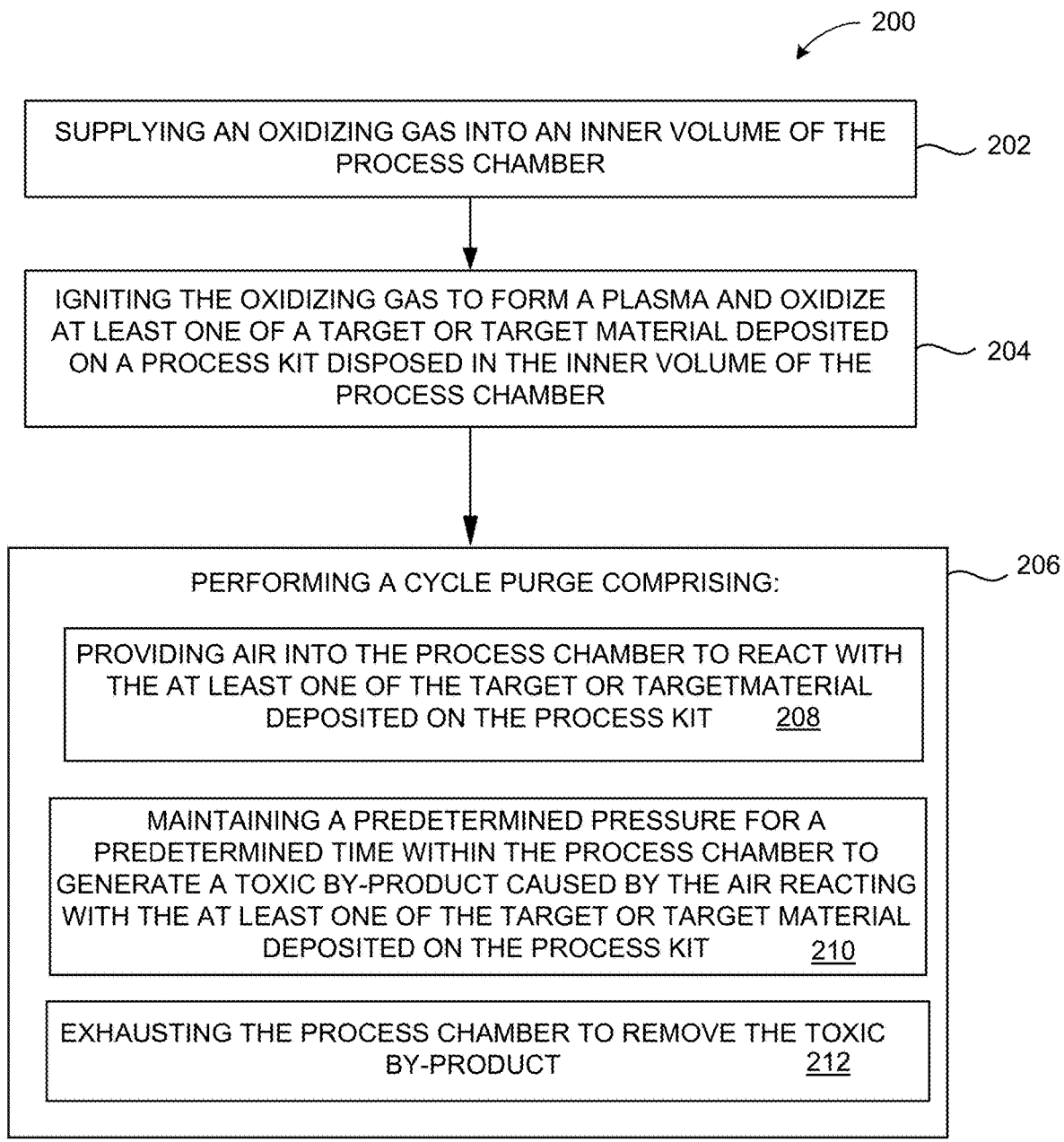
FIG. 2 is a flowchart of a method of passivating a target in a process chamber in accordance with some embodiments of the present disclosure.

FIG. 2 is a flowchart of a method 200 of passivating a target (e.g., target 106) in a process chamber (e.g., a process chamber 100) in accordance with some embodiments of the present disclosure. The method 200 quickly passivates a target surface (e.g., an OTS target surface) by oxidation of the OTS material using oxygen plasma. The high energy, high pressure oxygen plasma significantly accelerates the passivation process. The method 200 also uses a cycle pure that allows air to react with portions of the target that are not oxidized.

At 202, a first gas (e.g., oxygen, argon, helium, krypton, neon, radon, xenon or one or more other suitable non-reactive gases) can be supplied into an inner volume (e.g., inner volume 148) of the process chamber. For example, in at least some embodiments, an oxidizing gas, such as oxygen, can be supplied into the inner volume using one or more gas sources, such as the gas source 154.

At 204, the first gas can be ignited to form a plasma and oxidize at least one of the target or target material deposited on a process kit disposed in the process chamber. For example, one or more of an RF power source and/or a DC power source (e.g., the RF power source 118 and/or the DC power source 120) can be used to ignite the first gas. In at least some embodiments, the RF power source 118 can be used to ignite the first gas. To facilitate igniting the first gas, in at least some embodiments, the first gas can be provided at about 150 sccm to about 200 sccm from the gas source 154, the valve 160 can be used to maintain a pressure within the process chamber 100 of about 50 mTorr to about 60 mTorr, and the RF power source 118 can provide of RF power of about 150 W to about 200 W. The oxygen plasma can be maintained for a predetermined time. For example, in at least some embodiments, the oxygen plasma can be maintained for about 2 to 3 seconds. Additionally, as plasma (e.g., the oxygen plasma and the argon plasma) can heat up the target to temperatures that can cause the target to crack, the plasma may need to be turned on and off to let the target cool (e.g., plasma pulsing or looping—plasma on—plasma off and cool—plasma on—plasma off and cool).

In at least some embodiments, prior to 202 and 204, another gas (e.g., a second gas), such as an inert gas, can be supplied/introduced into the inner volume of the process chamber. For example, one or more of argon, helium, krypton, neon, radon, xenon or one or more other suitable non-reactive gases may first be introduced into the inner volume and ignited as described above. In embodiments, argon can be introduced into the process chamber and ignited to form argon plasma. The inventors have found that forming argon plasma (or other nonreactive plasma) can facilitate forming oxygen plasma within the inner volume. In at least some embodiments, the argon gas can be introduced into the inner volume at a flow rate of about 150 sccm to about 200 sccm. The argon plasma can be maintained for a predetermined time frame prior to supplying the oxygen gas, e.g., maintaining the argon plasma for about 2 to 3 seconds. After such time, the argon gas supply can be turned off, and at 202 the oxygen gas can be supplied and at 204 can be ignited, as described above.

Continuing at 204, to facilitate the oxidation process of the target and/or the process kit, the inside the process chamber can be maintained at a relatively high pressure. For example, in at least some embodiments, the inner volume can be maintained at a pressure of about 50 mTorr, which is much higher than, typical, deposition pressures (e.g., 0.5 mTorr). The oxygen plasma oxidizes the surface of target surface and/or the process kit, which can also have target material deposited thereon, thus stabilizing the surface of target surface and/or the process kit. More particularly, after the surface of the target and/or the process kit is passivated (oxidized), reaction between the target material beneath the oxide on the target surface and reactive species (e.g., water/moisture in room air/environment) is prevented, and generation of toxic by-product is significantly reduced, if not completely eliminated. That is, after 204 the target surfaces that are covered by the oxide are inert and not toxic.

Next, at 206, a cycle purge can be performed. More particularly, at 208, the cycle purge can include venting air (e.g., room/fresh air) into the process chamber while the process chamber remains closed, e.g., using the gas source 154 and mass flow controller 156. Venting air into the process chamber allows the air to react with the at least one of the target or target material deposited on a process kit. That is, the air reacts with the portions of the target that are not oxidized at 204.

Air is continued to be vented into the process chamber until a predetermined pressure is reached inside the process chamber. For example, in at least some embodiments, the predetermined pressure can be about 600 Torr to about 760 Torr. Once the predetermined pressure is reached, at 210 the predetermined pressure is maintained for predetermined time within the process chamber to generate toxic by-product caused by the air reacting with the at least one of the target or target material deposited on a process kit. The predetermined time can be about 5 minutes to about 30 minutes.

Next, at 212, the process chamber can be exhausted to remove the toxic by-product. For example, in at least some embodiments, a pump, such as the pump 161, can be used to exhaust (pump down) the inner volume of the process chamber to remove the toxic by-product, e.g., hydride, arsine, etc.) through an exhaust port of the process chamber, e.g., the exhaust port 158.

In at least some embodiments, an amount of toxic by-product in the inner volume of the process chamber can be measured, using, for example, the gas detection system 163. The gas detection system 163 can measure the amount of toxic by-product prior to performing the method 200 and/or after each of 202-212. For example, in at least some embodiments, the gas detection system 163 can measure the amount of toxic by-product after a first run through the cycle purge (e.g., after 212), for example, using the sensor 165. In at least some embodiments, a control feedback loop can use the data received from the sensor 165 to control the gas source 154 and/or the mass flow controller 156 to repeat 206-212, e.g., until a predetermined threshold of toxic by-product has not been reached. In such embodiments, the data received from the sensor 165 at the gas detection system 163 can be transmitted to the controller 191 which can control the gas source 154 and the mass flow controller 156 to allow more air to be provided into the process chamber 100. Additionally, using the data received from the sensor 165 the controller 191 can control the pump 161 and/or the valve 160 to obtain a predetermined pressure and/or perform additional exhausting of the inner volume of the process chamber.

202-212, or portions thereof, can be repeated until a predetermined threshold of toxic by-product is detected by the gas detection system 163. For example, 202-212, or portions thereof, can be repeated until the gas detection system 163 detects an amount of toxic by-product that is about 0 ppb to about 100 ppb (and in some embodiments can be about 5 ppm). In at least some embodiments, 202-204 can be repeated one or more times prior to performing 206. Likewise, 206 can be repeated one or more times prior to performing and/or repeating 202-204. For example, in some embodiments, 202-204 can be performed up to and including about 100 times prior to performing 206. In some embodiments, 206 can be performed up to and including about 5 times. In some embodiments, a cycle of 202-204 can be performed up to and including about 100 times prior to performing 206, and, thereafter, 206 can be performed up to and including about 5 times. In some embodiments, the foregoing cycle can be repeated one or more times. For example, in some embodiments, the cycle can be repeated 8 or more times. Additionally, after the cycle is performed, or in any other embodiments, 206 can be repeated one or more additional times, e.g., 1, 2, 3, 4, etc. For example, in at least some embodiments, the 206 can be repeated up to and including 40 or more times.

Additionally, to facilitate cooling the target to prevent the target from overheating (or cracking) during passivation thereof, a cooling fluid can be supplied via one or more cooling channels/guides provided in a backing plate 146 to cool the target, such as during any or all of 202 to 212.

While the foregoing is directed to embodiments of the present disclosure, other and further embodiments of the disclosure may be devised without departing from the basic scope thereof.

The invention claimed is:

1. A process chamber for passivating surfaces of the process chamber, comprising:
   a target disposed in the process chamber for sputtering a target material onto a substrate disposed in the process chamber during processing;
   a gas source connected to the process chamber and configured to supply an oxidizing gas into an inner volume of the process chamber and configured to supply air into the inner volume of the process chamber without opening the process chamber;
   at least one of an RF power source or a DC power source configured to ignite the oxidizing gas to form a plasma within the process chamber;
   a pump configured to maintain a predetermined pressure and to exhaust the process chamber;
   a gas detection system configured to measure an amount of a toxic by-product in the inner volume of the process chamber; and
   a controller configured to control the process chamber to:
   a) supply the oxidizing gas into the inner volume of the process chamber from the gas source;
   b) ignite the oxidizing gas to form the plasma and oxidize at least one of the target or target material deposited on a process kit disposed in the inner volume of the process chamber; and c) perform a cycle purge comprising:
   c1) providing air into the process chamber to react with the at least one of the target or target material deposited on the process kit;
   c2) maintaining the predetermined pressure for a predetermined time within the process chamber to generate the toxic by-product caused by the air reacting with the at least one of the target or target material deposited on the process kit; and
   c3) exhausting the process chamber to remove the toxic by-product.

2. The process chamber of claim 1, wherein the controller is further configured to supply a non-reactive gas into the inner volume of the process chamber and ignite the non-reactive gas, prior to supplying the oxidizing gas into the process chamber.

3. The process chamber of claim 2, wherein the oxidizing gas is oxygen and the non-reactive gas is an inert gas.

4. The process chamber of claim 3, wherein the inert gas is at least one of argon, helium, krypton, neon, radon, or xenon.

5. The process chamber of claim 1, wherein the predetermined pressure is about 600 Torr to about 760 Torr.

6. The process chamber of claim 1, wherein the predetermined time is about 5 minutes to about 30 minutes.

7. The process chamber of claim 1, wherein the controller is further configured to after b) and before c), cool the target and then repeat a) through b).

8. The process chamber of claim 1, wherein the controller is further configured to after c3), repeat c1) through c3).

9. The process chamber of claim 1, wherein the target is made from at least one of arsenic, boron, carbon, gallium, germanium, selenium, silicon, tellurium, titanium or tungsten.

10. The process chamber of claim 1, wherein the controller is further configured to at least one of after or during a) through c3) measure an amount of the toxic by-product in the inner volume of the process chamber.

* * * * *